US010872863B2

(12) United States Patent
Choi et al.

(10) Patent No.: US 10,872,863 B2
(45) Date of Patent: Dec. 22, 2020

(54) SEMICONDUCTOR PACKAGE

(71) Applicant: SAMSUNG ELECTRONICS CO., LTD., Suwon-si (KR)

(72) Inventors: Joo Young Choi, Suwon-si (KR); Doo Hwan Lee, Suwon-si (KR); Da Hee Kim, Suwon-si (KR); Jae Hoon Choi, Suwon-si (KR); Byung Ho Kim, Suwon-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/216,946

(22) Filed: Dec. 11, 2018

(65) Prior Publication Data

US 2020/0075492 A1  Mar. 5, 2020

(30) Foreign Application Priority Data

Aug. 29, 2018 (KR) .................. 10-2018-0101836

(51) Int. Cl.
*H01L 23/538* (2006.01)
*H01L 23/31* (2006.01)
*H01L 23/00* (2006.01)

(52) U.S. Cl.
CPC ...... *H01L 23/5384* (2013.01); *H01L 23/3114* (2013.01); *H01L 23/3128* (2013.01);
(Continued)

(58) Field of Classification Search
CPC ............ H01L 23/5384; H01L 23/3114; H01L 23/3128
See application file for complete search history.

(56) References Cited

U.S. PATENT DOCUMENTS 9,859,222 B1   1/2018 Kim et al.
2016/0071820 A1*  3/2016 Yu ................ H01L 21/6835
                                                  257/737
(Continued)

FOREIGN PATENT DOCUMENTS

JP    2002-246500 A    8/2002
JP    2003-124391 A    4/2003
(Continued)

OTHER PUBLICATIONS

Communication dated Dec. 16, 2019 issued by the Korean Intellectual Property Office in counterpart Korean Application No. 10-2018-0101836.
(Continued)

*Primary Examiner* — Errol V Fernandes
(74) *Attorney, Agent, or Firm* — Sughrue Mion, PLLC

(57) ABSTRACT

A semiconductor package includes a connection member having a first surface and a second surface opposing each other and including a first redistribution layer on the second surface and at least one second redistribution layer on a level different from a level of the first redistribution layer; a semiconductor chip on the first surface of the connection member; a passivation layer on the second surface of the connection member, and including openings; UBM layers connected to the first redistribution layer through the openings; and electrical connection structures on UBM layers. An interface between the passivation layer and the UBM layers has a first unevenness surface, an interface between the passivation layer and the first redistribution layer has a second unevenness surface, connected to the first unevenness surface, and the second unevenness surface has a surface roughness greater than a surface roughness of the second redistribution layer.

20 Claims, 14 Drawing Sheets

(52) U.S. Cl.
CPC ............ *H01L 24/14* (2013.01); *H01L 24/96* (2013.01); *H01L 2224/0401* (2013.01); *H01L 2224/11526* (2013.01)

(56) References Cited

U.S. PATENT DOCUMENTS

| | | |
|---|---|---|
| 2016/0351494 A1 | 12/2016 | Chen et al. |
| 2016/0379915 A1 | 12/2016 | Lee et al. |
| 2017/0033065 A1 | 2/2017 | Chang et al. |
| 2018/0076151 A1 | 3/2018 | Min et al. |
| 2018/0082933 A1 | 3/2018 | Ko et al. |
| 2018/0096940 A1 | 4/2018 | Kim et al. |
| 2018/0190602 A1 | 7/2018 | Lee et al. |
| 2019/0139851 A1* | 5/2019 | Myung .................. H01L 24/73 |

FOREIGN PATENT DOCUMENTS

| | | |
|---|---|---|
| JP | 2014-165335 A | 9/2014 |
| JP | 2017228756 A | 12/2017 |
| KR | 10-2016-0140322 A | 12/2016 |
| KR | 10-2018-0032148 A | 3/2018 |
| KR | 1020180029452 A | 3/2018 |
| KR | 10-2018-0036095 A | 4/2018 |

OTHER PUBLICATIONS

Communication dated Mar. 3, 2020 from the Japanese Patent Office in application No. 2018-240174.

* cited by examiner

I-I'

B

US 10,872,863 B2

SEMICONDUCTOR PACKAGE

CROSS-REFERENCE TO RELATED APPLICATION(S)

This application claims benefit of priority to Korean Patent Application No. 10-2018-0101836 filed on Aug. 29, 2018 in the Korean Intellectual Property Office, the disclosure of which is incorporated herein by reference in its entirety.

TECHNICAL FIELD

The present disclosure relates to a semiconductor package.

BACKGROUND

A packaging technique for achieving device lightness, slimness and compactness has been actively studied. In this regard, it is very important to ensure reliability of a package against thermal stress in a manufacturing process or a use environment.

Such thermal stress may occur intensively at contact points between dissimilar materials. In detail, a redistribution layer in an insulating layer may be defective, thereby causing a problem of lowering package reliability.

SUMMARY

An aspect of the present disclosure is to provide a semiconductor package in which degradations in reliability due to thermal stress occurring between dissimilar materials may be reduced.

According to an aspect of the present disclosure, a semiconductor package includes a connection member having a first surface and a second surface opposing each other and including a plurality of redistribution layers located on different levels, the plurality of redistribution layers including a first redistribution layer disposed on the second surface and at least one second redistribution layer located on a level different from a level of the first redistribution layer; a semiconductor chip disposed on the first surface of the connection member and including a connection pad connected to the second redistribution layer; an encapsulant disposed on the first surface of the connection member and sealing the semiconductor chip; a passivation layer disposed on the second surface of the connection member, and including a plurality of openings respectively exposing portions of the first redistribution layer; a plurality of underbump metallurgy (UBM) layers connected to the portions of the first redistribution layer through the plurality of openings, respectively; and a plurality of electrical connection structures disposed on the plurality of UBM layers, respectively. An interface between the passivation layer and the plurality of UBM layers has a first unevenness surface, an interface between the passivation layer and the first redistribution layer has a second unevenness surface, connected to the first unevenness surface, and the second unevenness surface has a surface roughness greater than a surface roughness of the second redistribution layer.

According to an aspect of the present disclosure, a semiconductor package includes a connection member having a first surface and a second surface opposing each other, and including an insulating member and a plurality of redistribution layers located on different levels in the insulating member; a semiconductor chip disposed on the first surface of the connection member, and including a connection pad connected to the plurality of redistribution layers; an encapsulant disposed on the first surface of the connection member, and sealing the semiconductor chip; a passivation layer disposed on the second surface of the connection member; a plurality of UBM layers including a plurality of UBM pads disposed on the passivation layer, and a plurality of UBM vias passing through the passivation layer, to connect the plurality of UBM pads to the first redistribution layer, respectively; and a plurality of electrical connection structures respectively disposed on the plurality of UBM pads. An interface between the passivation layer and the UBM vias has a first unevenness surface, a surface of an outermost redistribution layer among the plurality of redistribution layers has a second unevenness surface, connected to the first unevenness surface, and the outermost redistribution layer has a surface roughness greater than a surface roughness of the other redistribution layers.

According to an aspect of the present disclosure, a semiconductor package includes a connection member including a first redistribution layer, a second redistribution layer, an insulating layer disposed between the first and second redistribution layers, and a via layer passing the insulating layer and connecting the first and second redistribution layers to each other; a semiconductor chip disposed on the connection member and including a connection pad connected to the second redistribution layer; an encapsulant sealing the semiconductor chip; a passivation layer disposed on the first redistribution layer and including an opening exposing a portion of the first redistribution layer; an underbump metallurgy (UBM) layer connected to the portion of the first redistribution layer through the opening in the passivation layer; and an electrical connection structure disposed on the UBM layer. Interfaces between the passivation layer and the UBM layer and between the passivation layer and the first redistribution layer extend continuously from a first contacting portion where the electrical connection structure, the UBM layer, and the passivation layer contact with each other to a second contacting portion where the insulating layer of the connection member, the first redistribution layer, and the passivation layer contact with each other, and have a surface roughness greater than a surface roughness of the second redistribution layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
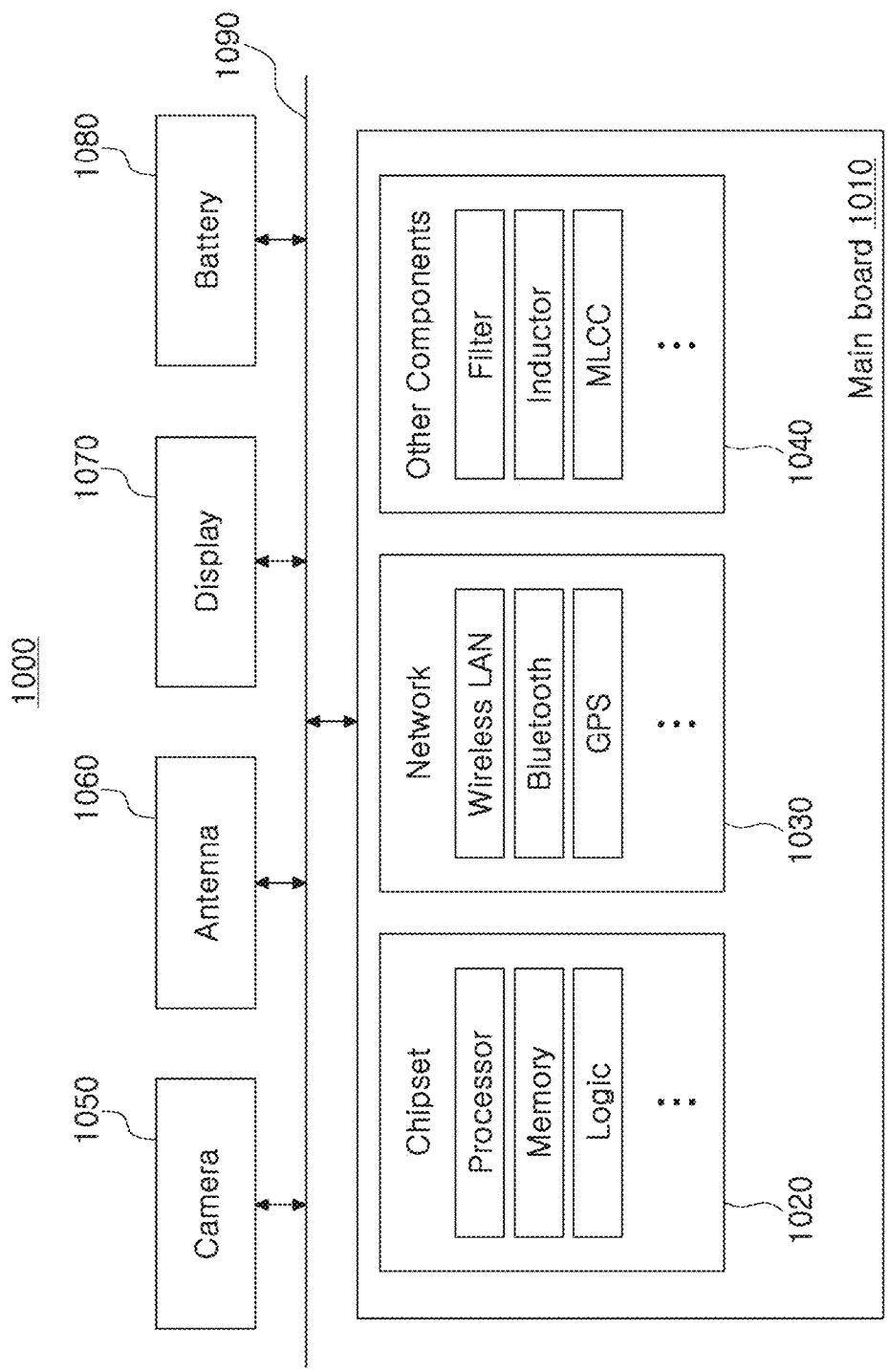
FIG. 1 is a schematic block diagram illustrating an example of an electronic device system.

Hereinafter, exemplary embodiments of the present disclosure will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
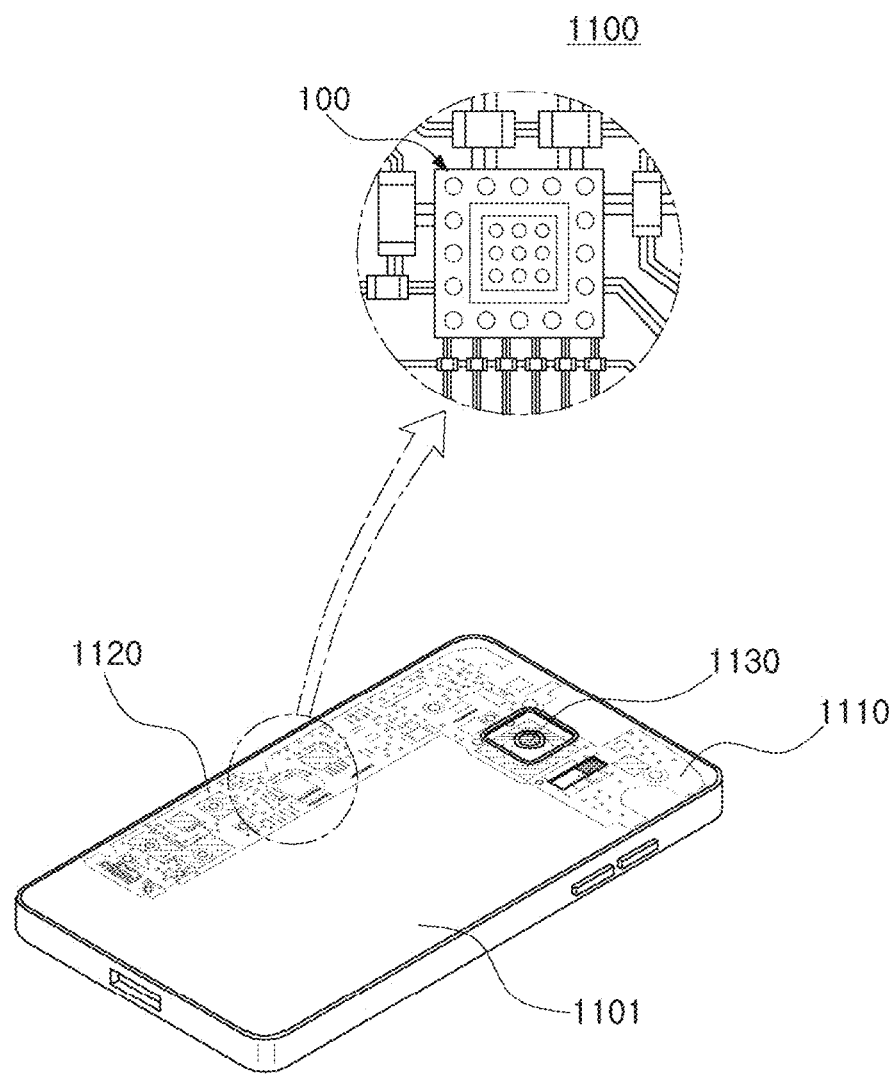
FIG. 2 is a schematic perspective view of an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
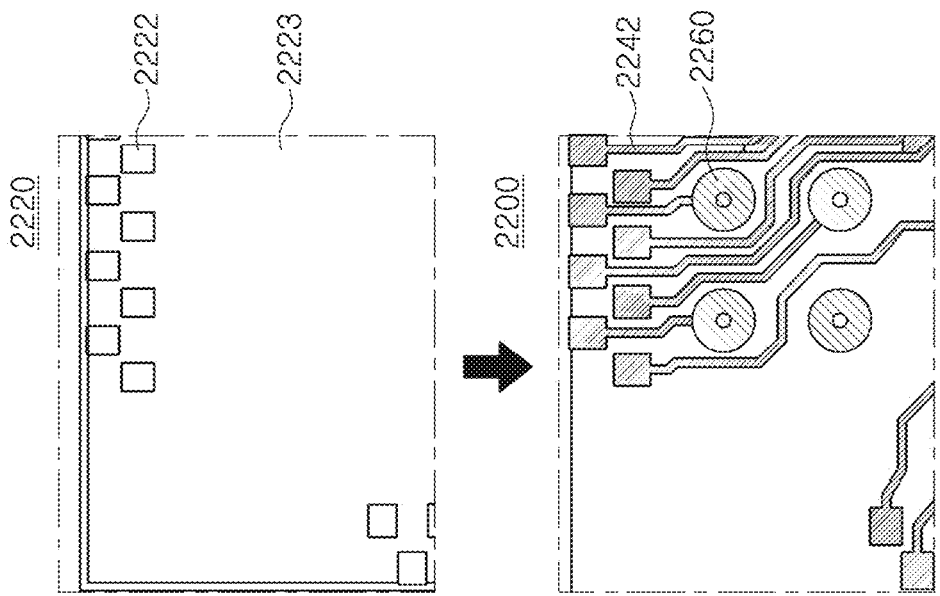
FIGS. 3A and 3B are cross-sectional views schematically illustrating a fan-in semiconductor package before and after packaging.
Figure 3A:
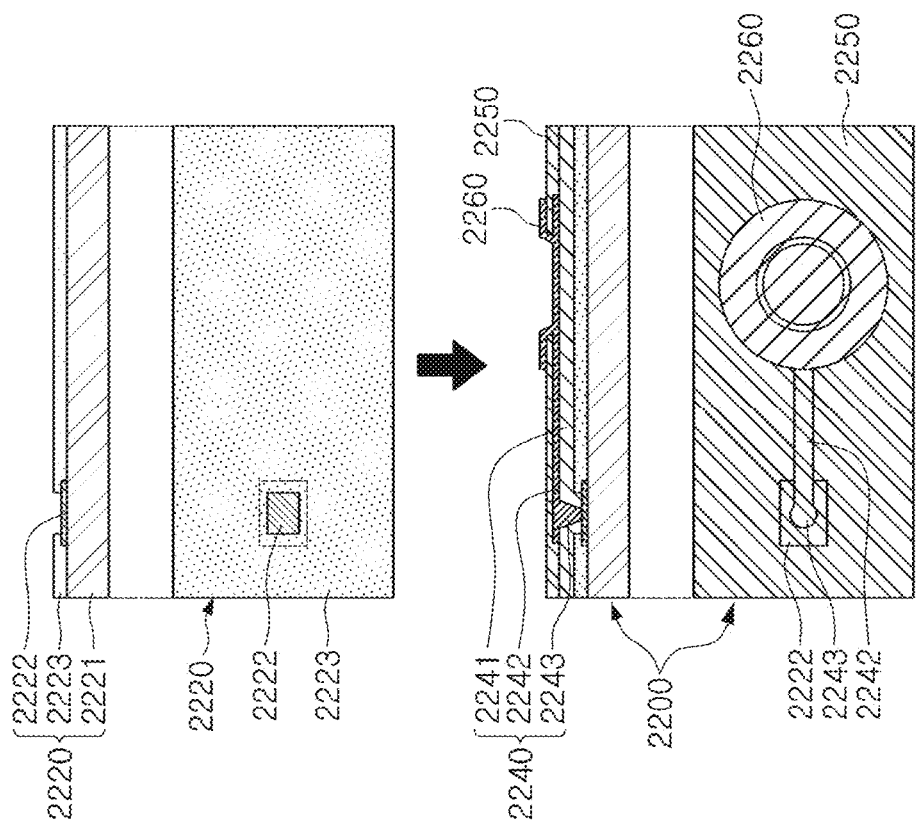
Figure 4:
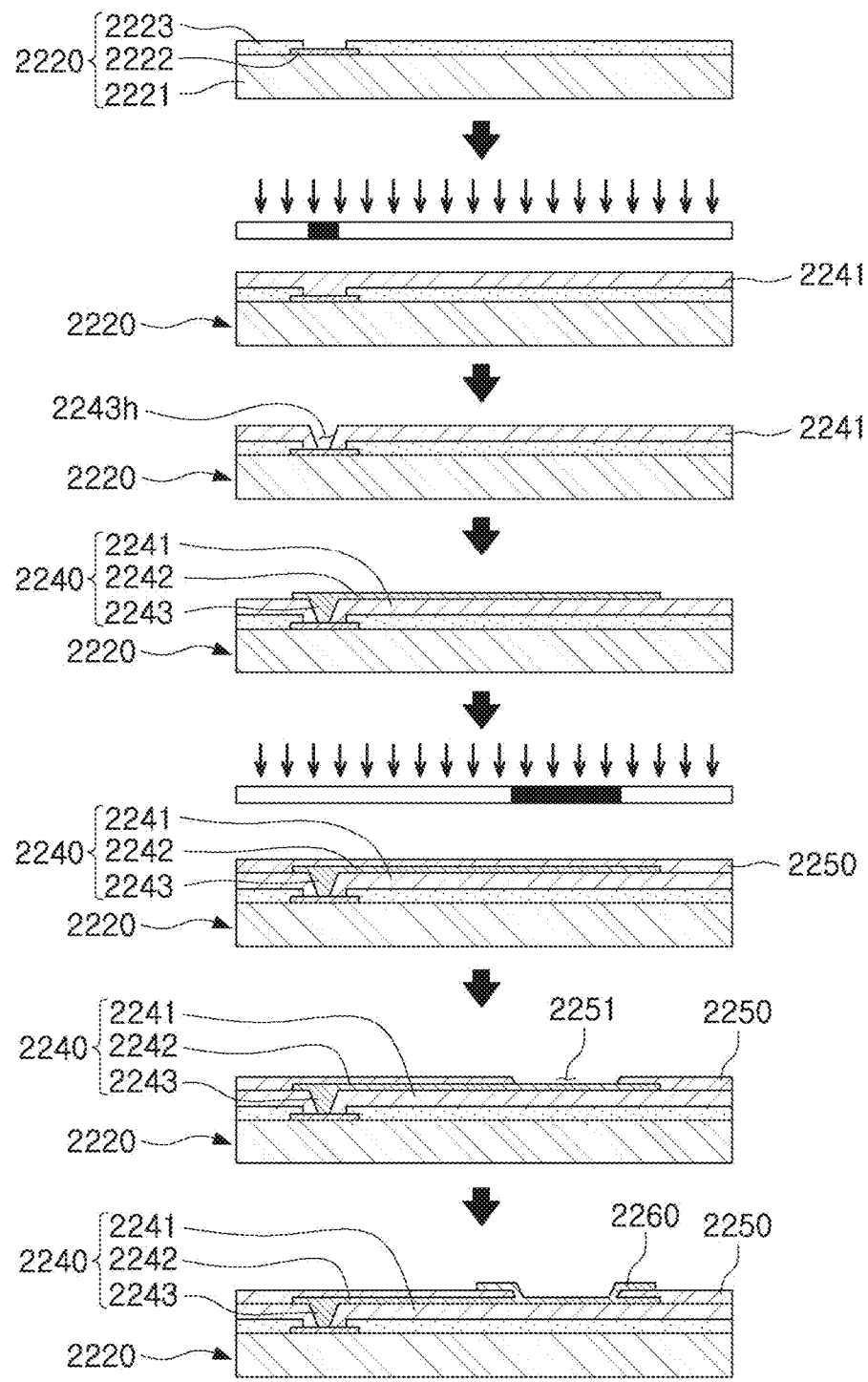
FIG. 4 is a schematic cross-sectional view of a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
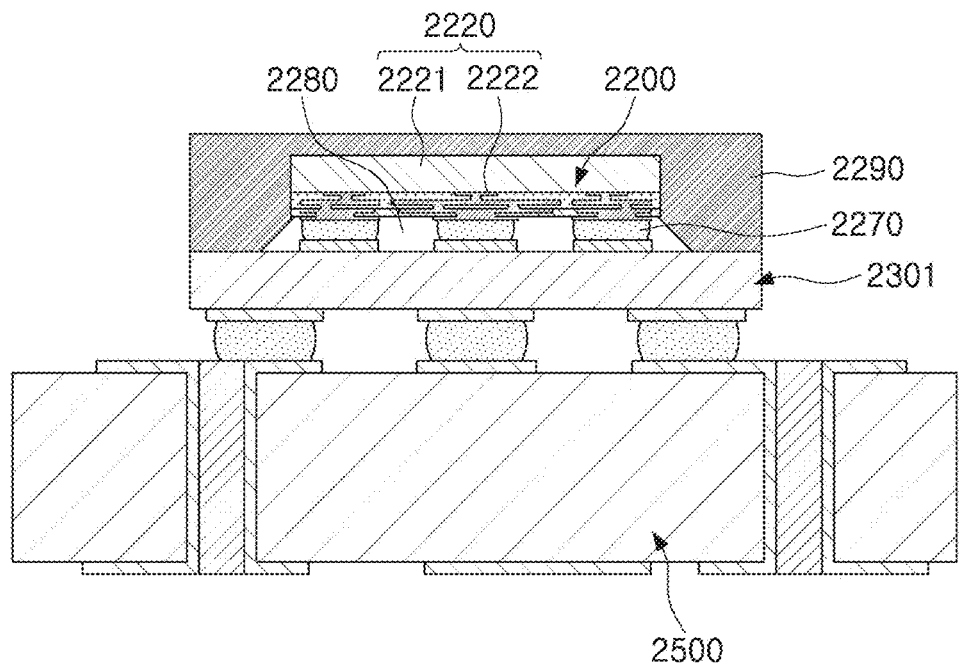
FIG. 5 is a cross-sectional view schematically illustrating a case in which a fan-in semiconductor package is mounted on an interposer substrate to ultimately be mounted on a main board of an electronic device.
Figure 6:
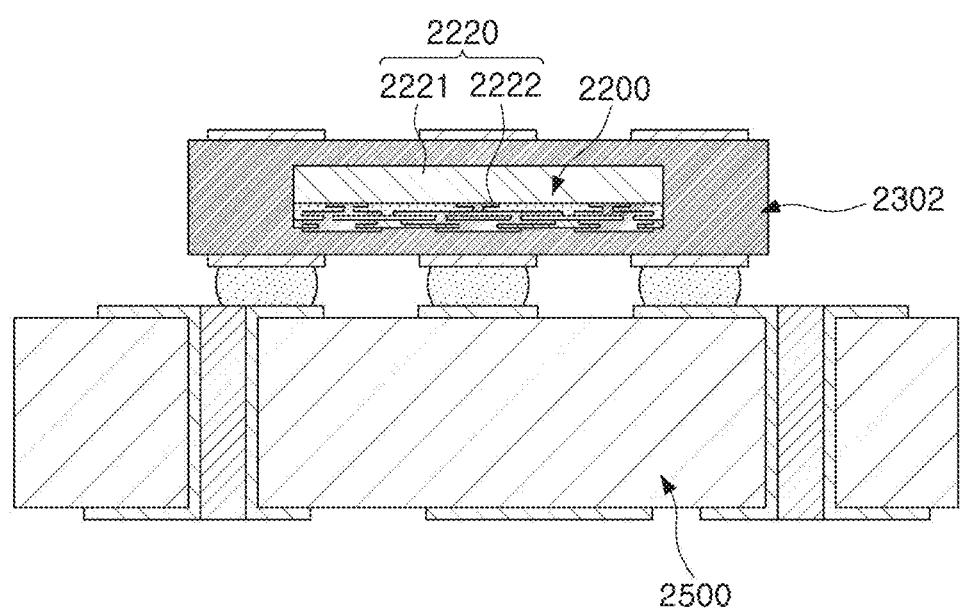
FIG. 6 is a cross-sectional view schematically illustrating a case in which a fan-in semiconductor package is embedded in an interposer substrate to ultimately be mounted on a main board of an electronic device.

FIG. 5 is a schematic cross-sectional view illustrating a fan-in semiconductor package mounted on an interposer substrate that is ultimately mounted on amain board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on amain board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-Out Semiconductor Package

Figure 7:
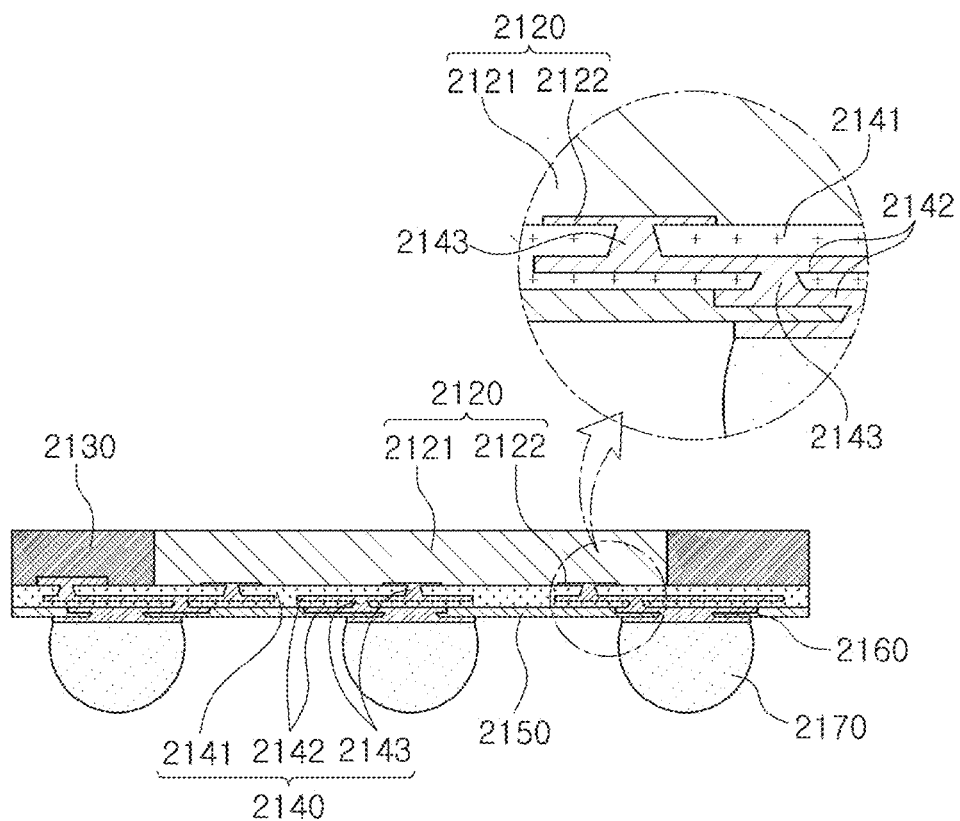
FIG. 7 is a schematic cross-sectional view of a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
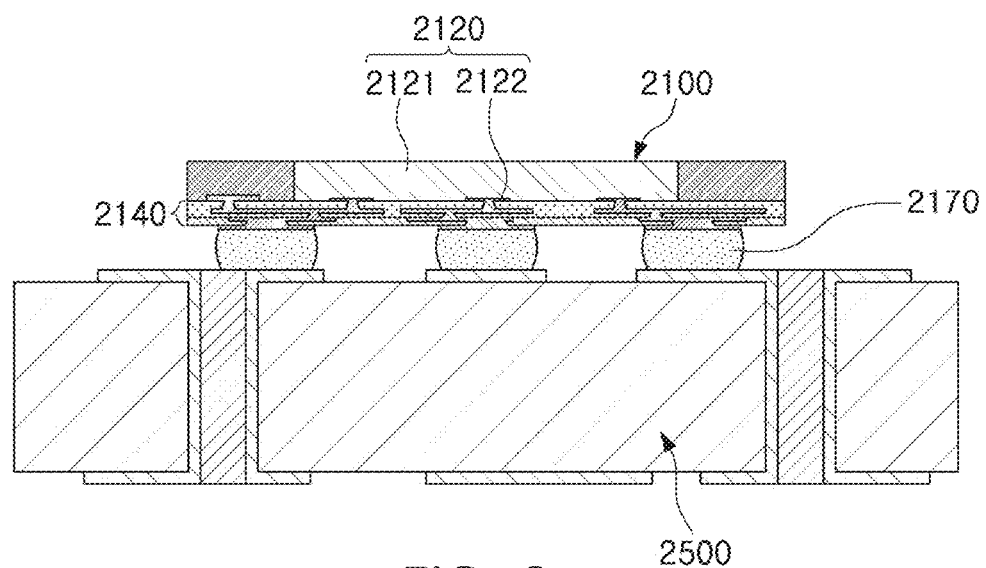
FIG. 8 is a schematic cross-sectional view of a case for a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
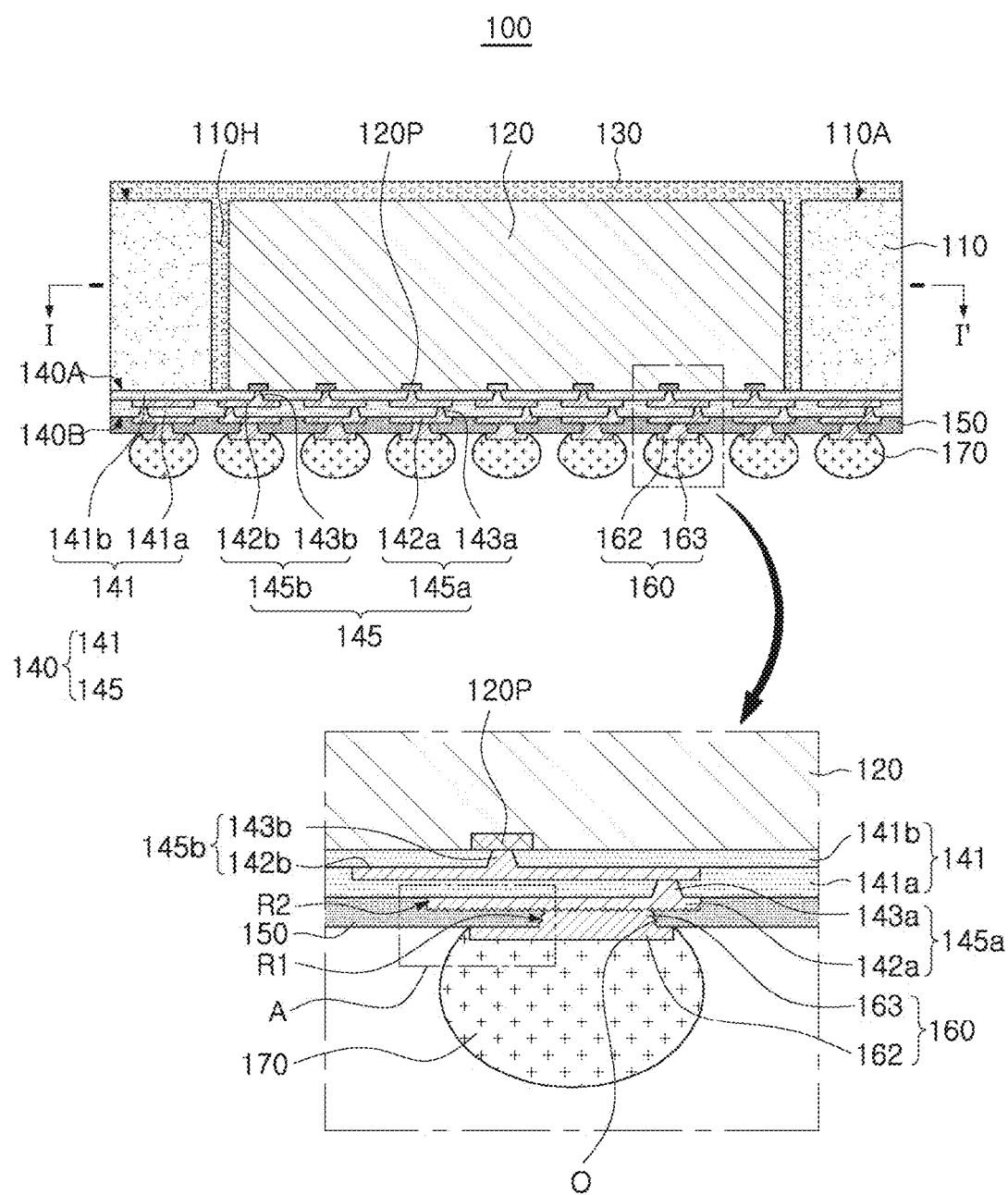
FIG. 9 is a schematic cross-sectional view of a semiconductor package according to an exemplary embodiment in the present disclosure.
Figure 10:
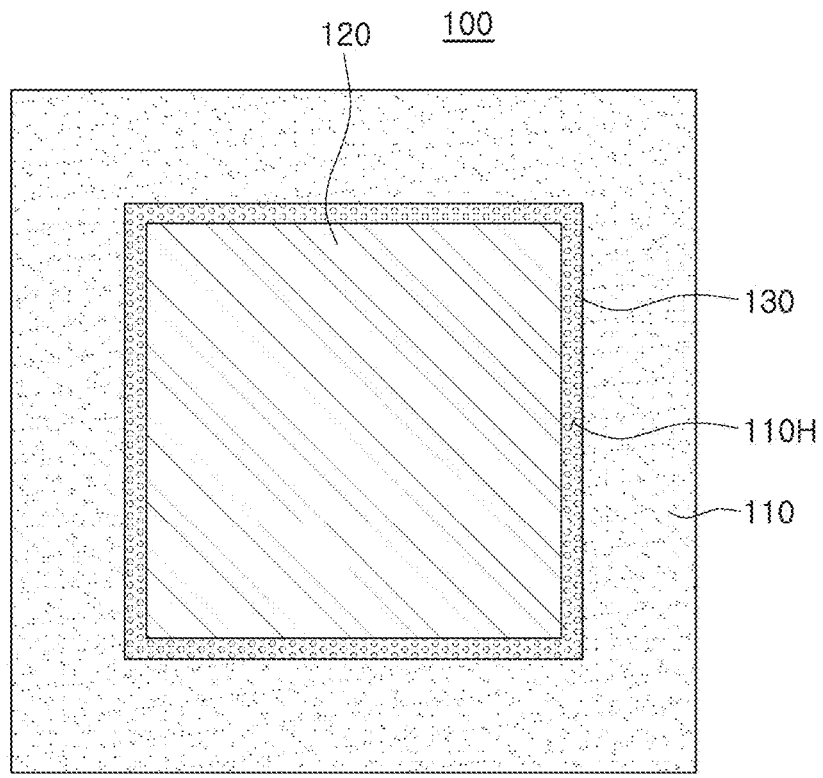
FIG. 10 is a plan view of the semiconductor package, taken along line I-I' in FIG. 9.

FIG. 9 is a schematic cross-sectional view of a semiconductor package according to an exemplary embodiment in the present disclosure, and FIG. 10 is a plan view of the semiconductor package, taken along line I-I' in FIG. 9.

Referring to FIGS. 9 and 10, a semiconductor package 100 according to the exemplary embodiment may include a connection member 140 having a first surface 140A and a second surface 140B opposite to each other, and including a redistribution layer (RDL) 145, a semiconductor chip 120 including a connection pad 120P disposed on the first surface 140A of the connection member 140 and connected to the redistribution layer 145, and an encapsulant 130 disposed on the first surface 140A of the connection member 140 and sealing the semiconductor chip 120.

The connection member 140 may include an insulating member 141 and the redistribution layer 145 formed on the insulating member 141. The redistribution layer 145 may include first and second redistribution layers 145a and 145b disposed on two different levels, for example, on first and second insulating layers 141a and 141b, respectively. Although the redistribution layer 145 employed in the exemplary embodiment is illustrated as having a two-layer structure, the redistribution layer may also have a single layer structure or a structure with different number of layers.

In this exemplary embodiment, the second redistribution layer 145b may include a second redistribution pattern 142b disposed on the second insulating layer 141b, and a second redistribution via 143b penetrating through the second insulating layer 141b to connect the second redistribution pattern 142b and the connection pad 120P of the semiconductor chip 120 to each other; and the first redistribution layer 145a may include a first redistribution pattern 142a disposed on the first insulating layer 141a, and a first redistribution via 143a penetrating through the first insulating layer 141a to connect the first and second redistribution patterns 142a and 142b to each other. In this case, the first redistribution pattern 142a may be a pattern disposed on the second surface 140B of the connection member 140 and may be referred to as a 'redistribution pattern for a pad.'

The semiconductor package 100 may include a passivation layer 150 disposed on the second surface 140B of the connection member 140, and an underbump metallurgy (UBM) layer 160 connected to the first redistribution pattern 142a (or, to the first redistribution layer 145) through a plurality of openings of the passivation layer 150.

The UBM layer 160 employed in the exemplary embodiment may include a plurality of UBM pads 162 disposed on the passivation layer 150, and a plurality UBM vias 163 penetrating through the passivation layer 150, to connect the plurality of UBM pads 162 and the first redistribution pattern 142a, respectively. The first redistribution pattern 142a may have a shape corresponding to the UBM pads 162 respectively, relevant thereto.

The semiconductor package 100 may include a plurality of electrical connection structures 170 disposed on a plurality of UBM layers 160, in detail, on the plurality of UBM pads 162, respectively. The semiconductor package 100 may be mounted on a pad of a substrate such as a main board, using the electrical connection structures 170. In this case, the UBM layer 160 may suppress cracking of the electrical connection structure 170 occurring due to thermal shock between the electrical connection structure 170 and the redistribution layer 145, thereby improving package reliability.

However, despite the introduction of the UBM layer 160, since the semiconductor package is composed of elements of various different materials, thermal stress may occur due to a difference in thermal expansion coefficients between different materials. This thermal stress may be a cause of defects such as interfacial delamination or cracking between different materials. In detail, this thermal stress may be relatively serious around the UBM layer 160, which will be described in detail with reference to FIG. 11.

Figure 11:
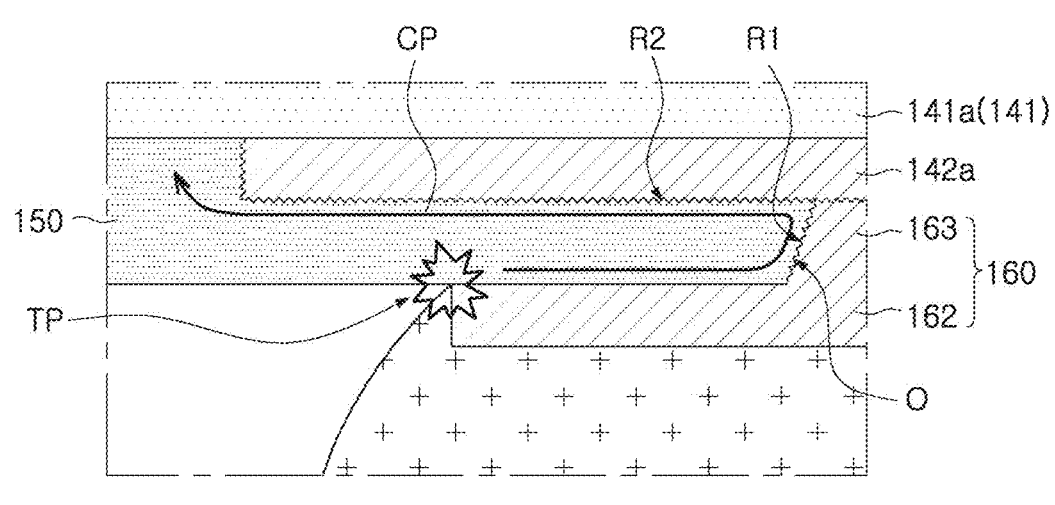
FIG. 11 is an enlarged cross-sectional view illustrating portion A of the semiconductor package of FIG. 9.

FIG. 11 is an enlarged cross-sectional view illustrating portion A of the semiconductor package of FIG. 9.

Referring to FIG. 11 together with FIG. 9, the electrical connection structure 170 formed of a material different from that of the UBM layer 160 may be disposed on the passivation layer 150 around the UBM layer 160, to be contacted between three dissimilar materials (see a triple point TP in FIG. 11). At such a triple point, a change in temperature may cause a relatively large amount of thermal stress, and such thermal stress may propagate along a path CP defined by an interface between the dissimilar materials. In detail, thermal stress may propagate along an interface of the UBM layer 160 in contact with the passivation layer 150 and a surface of the first redistribution pattern 142a adjacent thereto, and thus, cracks may occur. In detail, if the redistribution layer m 145 of the connection member 140 is damaged, the reliability of a semiconductor package may be seriously affected.

In the exemplary embodiment, to prevent thermal stress and cracking C from the triple point TP adjacent to the UBM layer 160 from propagating and damaging the redistribution layer 145, an unevenness surface having a sufficient degree of surface roughness may be provided on the path CP of propagation.

As illustrated in FIGS. 9 and 11, an interface between the passivation layer 150 and the plurality of UBM layers 160 may have a first unevenness surface R1, and an interface between the passivation layer 150 and the first redistribution layer 145a, in detail, the first redistribution pattern 142a, may have a second unevenness surface R2 connected to the first unevenness surface R1. In detail, the first unevenness surface R1 may be formed on a sidewall of the UBM via 163 located in an opening O of the passivation layer 150, and the first unevenness surface R1 may be an interface between the UBM via 163 and the passivation layer 150, as an example.

Figure 14A:
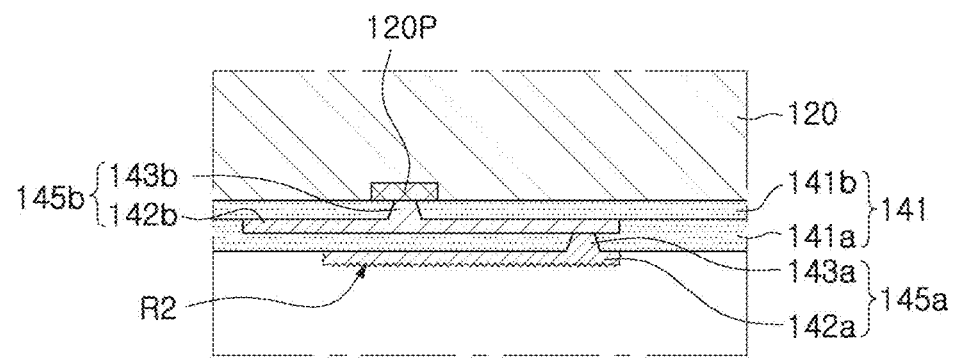
FIGS. 14A to 14D are cross-sectional views illustrating main processes of a method of manufacturing a semiconductor package according to an exemplary embodiment.
Figure 14B:
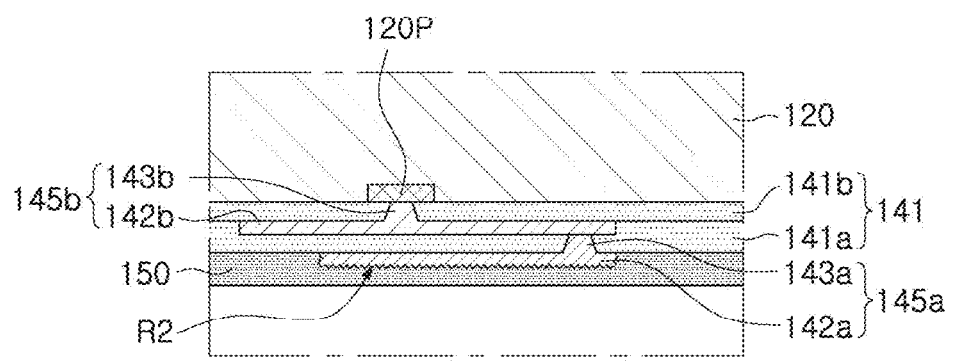
Figure 14C:
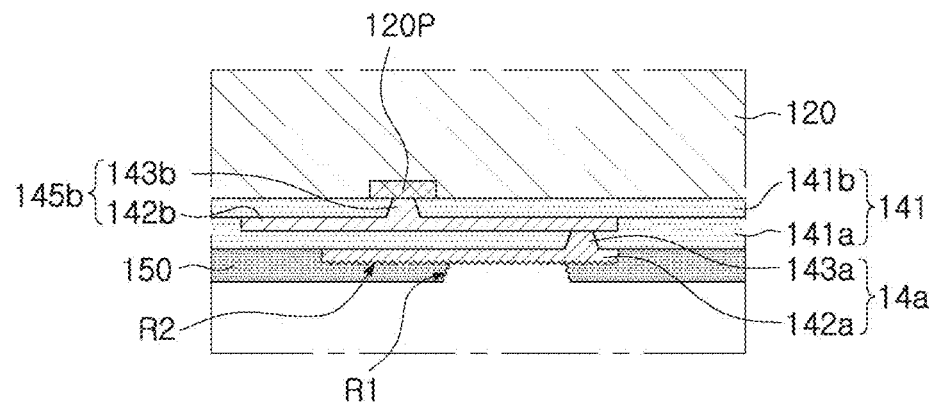
Figure 14D:
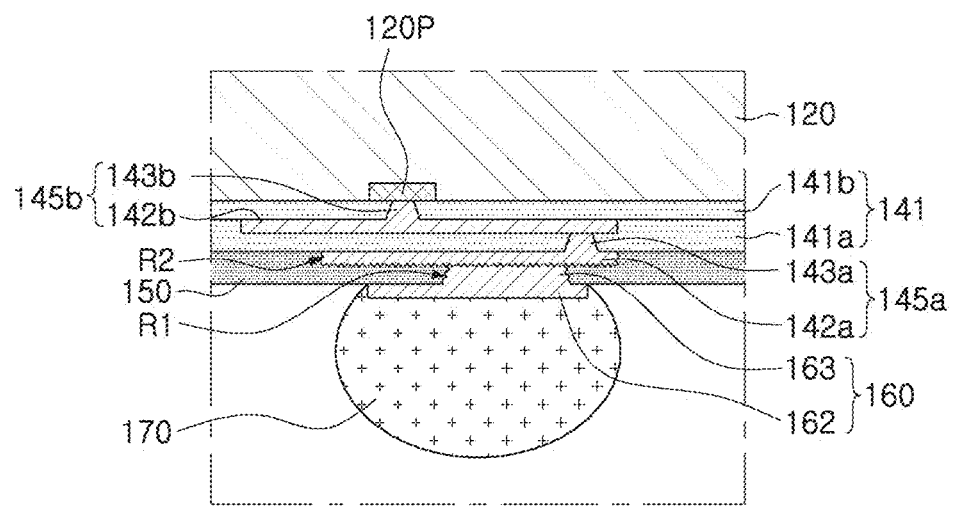
Figure 14E:
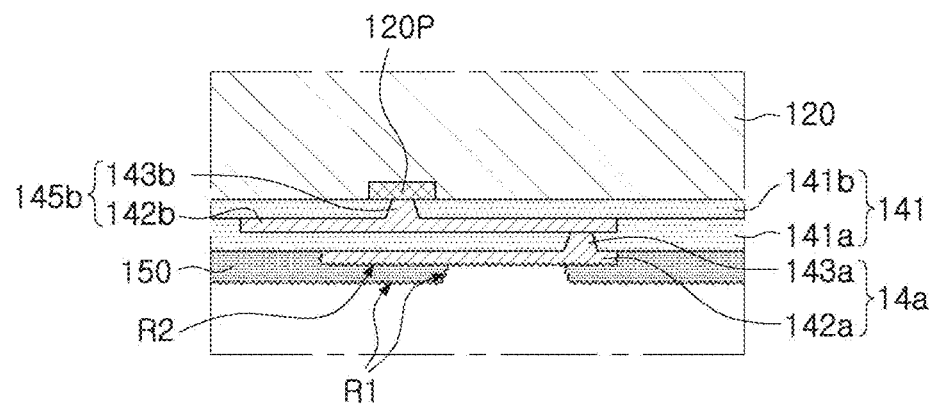
FIGS. 14E and 14F are cross-sectional views illustrating main processes of a method of manufacturing a semiconductor package according to an exemplary embodiment.
Figure 14F:
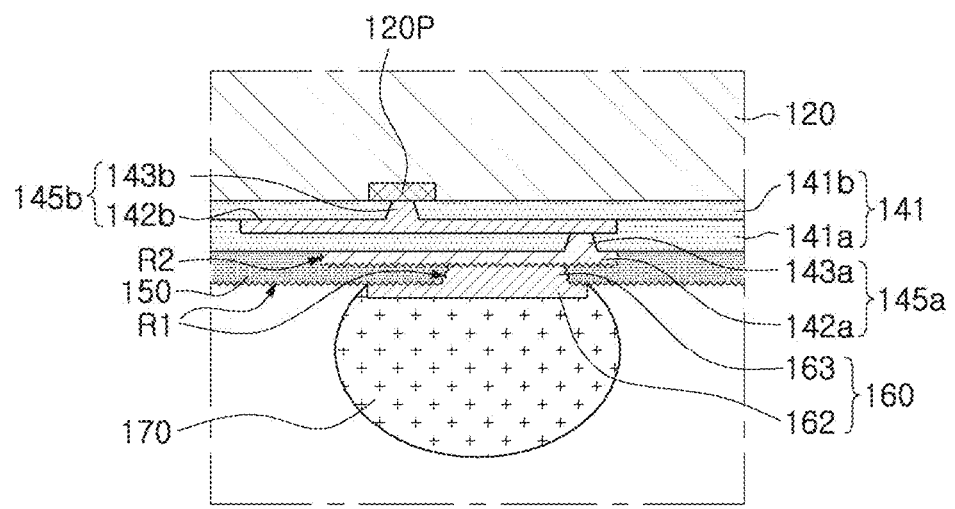

Referring to another example according to another embodiment shown in FIG. 14F, the first unevenness surface R1 may be also formed on a lower surface of the passivation layer 150. In this case, the first unevenness surface R1 may include the interface between the UBM via 163 and the passivation layer 150 and also include an interface between the passivation layer 150 and the UBM pad 162. The first unevenness surface R1 may extend continuously between the interface between the UBM via 163 and the passivation layer 150 and the interface between the passivation layer 150 and the UBM pad 162. In this case, the interfaces between the passivation layer 150 and the UBM layer 160 and between the passivation layer 150 and the first redistribution layer 142a may extend continuously from a first contacting portion where the electrical connection structure 170, the UBM layer 160, and the passivation layer 150 contact with each other to a second contacting portion where the first insulating layer 141a, the first redistribution layer 142a, and the passivation layer 150 contact with each other The second unevenness surface R2 of the first redistribution layer 145a, in detail, the first redistribution pattern 142a, located on an outermost portion, may be intentionally provided with unevenness through a separate process, while the second redistribution layer 145b, in detail, the second redistribution pattern 142b, may not be provided with such an unevenness process applied thereto. Thus, the second unevenness surface R2 may have a degree of surface roughness greater than that of the second redistribution layer 145b, in detail, the second redistribution pattern 142b.

The first unevenness surface R1 and the second unevenness surface R2 may be continuously disposed. The first and second unevenness surfaces R1 and R2 may increase a contact area between the passivation layer 150 and a metal element, for example, the UBM layer 160 and the first redistribution layer 145, thereby enhancing adhesion and effectively blocking propagation of stress occurring around the UBM layer 160. In a case that the first redistribution layer 145a and the UBM layer 160 disposed thereon are made of a same material, an interface thereof may not be visible.

Figure 12:
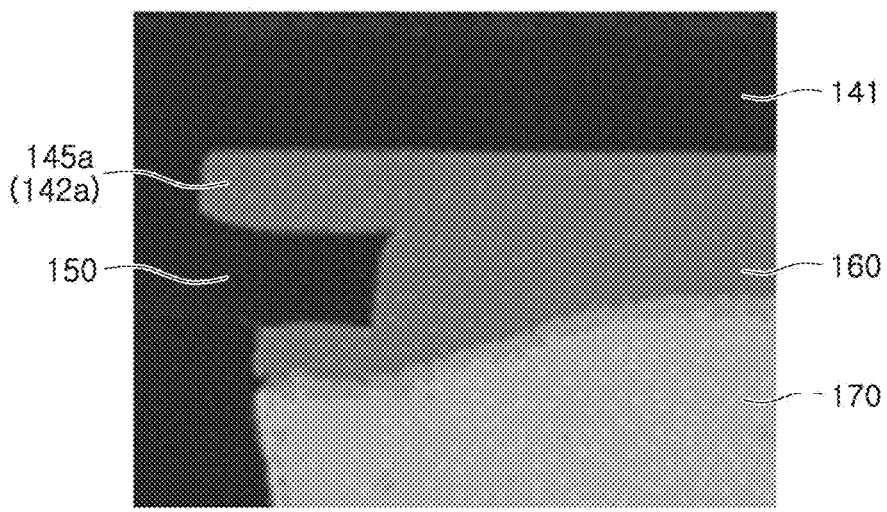
FIGS. 12 and 13 illustrate enlarged images provided by capturing portions of semiconductor packages, according to a comparative example to which unevenness is not applied and an exemplary embodiment of the present disclosure to which unevenness is applied, respectively.
Figure 13:
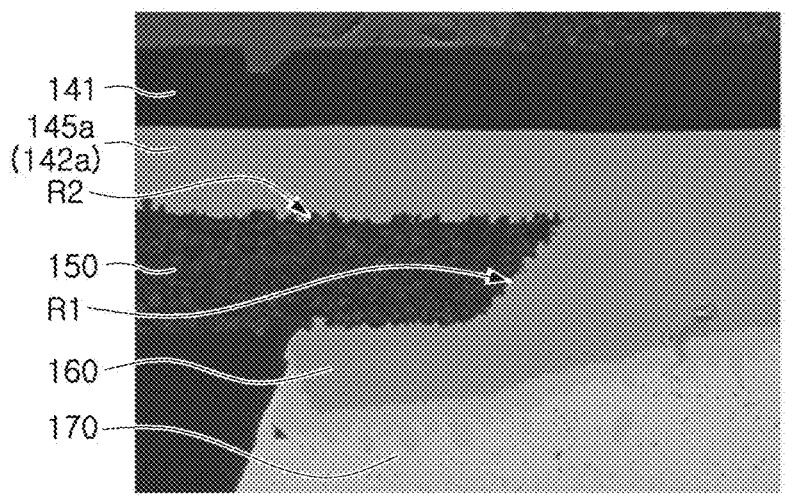

FIGS. 12 and 13 illustrate enlarged images provided by capturing portions of semiconductor packages, according to a comparative example to which unevenness is not applied and an exemplary embodiment of the present disclosure to which unevenness is applied, respectively.

Referring to FIG. 12, a UBM layer 160 and a first redistribution layer 145a have surfaces on which unevenness is not formed. Interfaces of the UBM layer 160 and the first redistribution layer 145a in contact with a passivation layer 150 provide a relatively smooth state. In the case of such interfaces, not only the progress of adhesion may be relatively slow with low adhesion strength, but also cracks occurring around the UBM layer may easily propagate along a smooth surface, to damage a redistribution layer 145.

Differently therefrom, referring to FIG. 13, it can be seen that a UBM layer 160 and a first redistribution layer 145a have unevenness formed on surfaces thereof contacting a passivation layer 150. A first unevenness surface R1 positioned between the passivation layer 150 and the UBM layer 160 may be continuously disposed with a second unevenness surface R2 positioned between the passivation layer 150 and the first redistribution layer 145a. These first and second unevenness surfaces R1 and R2 may enhance adhesion and effectively block propagation of stress occurring from around the UBM layer 160.

Surface roughness (RMS) of the first unevenness surface R1 and the second unevenness surface R2 may be in the range of 1 to 3 μm, but is not limited thereto. The second unevenness surface R2 of an outermost first redistribution layer 145a may have a surface roughness at least greater than a surface roughness of a different redistribution layer, for example, a second redistribution layer 145b. For example, a surface roughness of the redistribution layer, for example, the second redistribution layer 145b, on which unevenness is not formed intentionally, may be 0.5 μm or less.

In the exemplary embodiment, the first unevenness surface R1 and the second unevenness surface R2 may be formed by different processes. Thus, the first unevenness surface R1 and the second unevenness surface R2 may have different degrees of surface roughness.

Hereinafter, respective components of the semiconductor package according to the exemplary embodiment will be described in more detail.

A support member 110 may improve rigidity of the semiconductor package 100, and may serve to secure uniformity of a thickness of the encapsulant 130, or the like. The support member 110 may include one or more redistribution layers and one or more redistribution vias connected to those redistribution layers in the connection member 140. These features will be described later with reference to, for example, FIG. 16. Thus, the number of the distribution patterns and the number of the redistribution vias needed in the connection member 140 for providing a certain level of distribution capacity may be reduced, as compared to an example in which a support member does not include such redistribution layers and such redistribution vias. In a case in which the support member 110 includes one or more redistribution layers and one or more redistribution vias, the semiconductor package 100 may also be used as a package-on-package (POP)-type fan-out package. The semiconductor chip 120 in a cavity 110H may be configured to be spaced apart from a sidewall of the support member 110 by a predetermined distance. A periphery of a side surface of the semiconductor chip 120 may be surrounded by the support member 110, which is merely provided as an example. Thus, an exemplary embodiment thereof may be variously modified in other forms, and other functions may be performed according to the forms. In some embodiments, the support member 110 may be omitted.

The support member 110 may include an insulating material. For example, the insulating material may include a thermosetting resin such as an epoxy resin or a thermoplastic resin such as polyimide, and may be provided as a resin in which these resins are mixed with an inorganic filler or are impregnated with a core material such as a glass fabric or the like, together with an inorganic filler. In a specific example, as the support member, a prepreg resin, Ajinomoto Build-up Film (ABF), FR-4 resin, bismaleimidetriazine (BT) resin, or the like may be used. For example, when the support member 110 having a relatively high degree of rigidity, such as a prepreg resin including a glass fabric or the like, is used, warpage of the semiconductor package 100 may be controlled.

The semiconductor chip 120 may be an integrated circuit (IC) in which hundreds to millions of devices are integrated into a single chip. In this case, the integrated circuit may be a processor chip, such as a central processor, for example, a central processing unit (CPU), a graphics processor, for example, a graphics processing unit (GPU), a field programmable gate array (FPGA), a digital signal processor, a cryptographic processor, a microprocessor, a microcontroller, or the like, in detail, an application processor (AP), but is not limited thereto. For example, the integrated circuit may be a logic chip, such as an analog-to-digital converter, an application-specific integrated circuit (IC) or the like, or may be a memory chip, such as a volatile memory, for example, a dynamic random access memory (DRAM), a nonvolatile memory, for example, a read only memory (ROM), a flash memory or the like, and further, may also be provided by combinations thereof and by positioning the combinations.

The semiconductor chip 120 may be formed, based on an active wafer. In this case, as a base material forming a body, silicon (Si), germanium (Ge), gallium arsenic (GaAs), or the like may be used. Various types of circuits may be formed in the body. The connection pad 120P may be provided to electrically connect the semiconductor chip 120 to other components. As a material of the connection pad 120P, a conductive material such as aluminum (Al) may be used without any particular limitations. A passivation film (not illustrated) may be formed on the body, to expose the connection pad 120P. The passivation film may be an oxide film, a nitride film or the like, or may be a double layer of an oxide film and a nitride film. A lower surface of the connection pad 120P may have a step portion with a lower surface of the encapsulant 130 through the passivation film, by which the encapsulant 130 may be prevented from bleeding into the lower surface of the connection pad 120P to some extent. An insulating film (not illustrated) or the like may further be disposed in a required position. Although the semiconductor chip 120 may be a bare die, a redistribution layer (not illustrated) may further be formed on an active surface of the semiconductor chip 120, on which the connection pad 120P has been formed, as required, and the semiconductor chip 120 may also have a form in which a bump (not illustrated) or the like is connected to the connection pad 120P.

The encapsulant 130 may be configured to have a structure to protect electronic components such as the support member 110, the semiconductor chip 120 and the like. The form of sealing is not particularly limited, and may be any form as long as it covers at least portions of the support member 110, the semiconductor chip 120 and the like. For example, the encapsulant 130 may cover upper surfaces of the support member 110 and the semiconductor chip 120, and may fill a space between a sidewall of the cavity 110H and a side surface of the semiconductor chip 120. In addition, the encapsulant 130 may fill at least a portion of a space between the semiconductor chip 120 and the connection member 140. By filling the cavity 110H with the encapsulant 130, the encapsulant 130 may serve as an adhesive according to a detailed material, and furthermore, may serve to reduce buckling.

For example, as the encapsulant 130, a thermosetting resin such as an epoxy resin or a thermoplastic resin such as polyimide may be used. Alternatively, a resin in which these resins are mixed with an inorganic filler or are impregnated with a core material such as glass fabric or the like together with an inorganic filler, may be used. For example, a prepreg resin, ABF resin, FR-4 resin, BT resin or the like may be used. In some embodiments, a photoimageable dielectric (PID) resin may be used.

The connection member 140 may include an insulating member 141 and the redistribution layer 145 formed on the insulating member 141, as described above. The insulating member 141 may include a thermosetting resin such as an epoxy resin or a thermoplastic resin such as polyimide. For example, a prepreg resin, ABF resin, FR-4 resin, BT resin or the like may be used. In a specific example, the insulating member 141 may be formed using a photoimageable insulating material such as a PID resin. In the case of using a photoimageable material, respective insulating layers 141a and 141b may be formed to have a relatively reduced thickness, and a fine pitch of the redistribution via 143a/143b may be more easily obtained. For example, in the case of the respective insulating layers 141a and 141b, a thickness between patterns except for the redistribution pattern 142a/142b may be within the range of about 1 µm to about 10 µm.

In the exemplary embodiment, the insulating member 141 may include a photoimageable insulating material such as a PID resin, and the passivation layer 150 may include a thermosetting resin or a thermoplastic resin, as a non-photoimageable insulating material.

The redistribution pattern 142a/142b may perform various functions according to the design of relevant layers. For example, the redistribution pattern 142a/142b may include a ground (GND) pattern, a power (PoWeR: PWR) pattern, and a signal (Signal: S) pattern. In this case, the signal S pattern may include various signals except for a ground (GND) pattern, a power (PWR) pattern and the like, for example, include a data signal or the like. In addition, the redistribution pattern 142a/142b may include a via-pad pattern, an electrical connection structure pad pattern, or the like. For example, the redistribution pattern 142a/142b may include a conductive material, such as copper (Cu), aluminum (Al), silver (Ag), tin (Sn), gold (Au), nickel (Ni), lead (Pb), titanium (Ti), or alloys thereof. For example, a thickness of the redistribution pattern 142a/142b may range from about 0.5 µm to about 15 µm.

The redistribution via 143a/143b may be used as an element located on another level. For example, the redistribution via 143a/143b may include a conductive material, such as copper (Cu), aluminum (Al), silver (Ag), tin (Sn), gold (Au), nickel (Ni), lead (Pb), titanium (Ti), alloys thereof, or the like.

The redistribution via 143a/143b may be entirely filled with a conductive material, or may be obtained as a conductive material is formed along a wall of a via. For example, the redistribution via 143a/143b may have various other shapes, such as a tapered shape or a cylindrical shape.

The electrical connection structure 170 may be formed of a conductive material, for example, a low melting-point alloy such as Sn—Al—Cu, but a material thereof is not limited thereto. The electrical connection structure 170 may be a land, a ball, a pin, or the like. The electrical connection structure 170 may be formed of multiple layers or a single layer. For example, when the electrical connection structure 170 is formed of multiple layers, the electrical connection structure 170 may include a copper pillar and a low-melting point alloy. The number, spacing, arrangement type, and the like of the electrical connection structures 170 are not particularly limited, and may be sufficiently modified according to the design specifications in the art.

Hereinafter, a method of manufacturing a semiconductor package according to an exemplary embodiment in the present disclosure will be described with reference to the accompanying drawings. Various features and advantages will be understood in detail in describing the method below.

FIGS. 14A to 14D are cross-sectional views illustrating main processes of a method of manufacturing a semiconductor package according to an exemplary embodiment, and are enlarged cross-sectional views of portion A in the semiconductor package 100.

The method of manufacturing a semiconductor package according to an exemplary embodiment may be a method of manufacturing the semiconductor package 100 illustrated in FIG. 9, in which an unevenness forming process after formation of a connection member is provided.

Referring to FIG. 14A, a connection member 140 may be formed to include first and second redistribution layers 145a and 145b, on an active surface of a semiconductor chip 120.

The first redistribution layer 145a may include a first redistribution pattern 142a and a first redistribution via 143a. A second unevenness surface R2 may be formed on a surface of the first redistribution pattern 142a.

The second unevenness surface R2 may be obtained by roughening the surface of the first redistribution layer 145a after the first redistribution layer 145a is formed. Since an exposed surface of the first redistribution layer 145a is a surface of the first redistribution pattern 142a, the second unevenness surface R2 may be formed on the surface of the first redistribution pattern 142a.

For example, when the first distribution pattern 142a is formed of copper (Cu), an etchant containing $H_2O_2$ and $H_2SO_4$ may be used. Unevenness may be formed on the surface of the first redistribution pattern 142a by performing etching for a predetermined period of time.

Alternatively, the first redistribution layer 145a may be formed to have a degree of roughness greater than a normal degree of surface roughness by adjusting plating process conditions. For example, the current density for an electroplating process appropriate thereto may be selected depending on an electrolyte composition, a temperature of electrolyte, or the like. A plating process for the first redistribution layer 145a may first be performed by applying the current density for an appropriate electroplating process, and then, in the latter half of the plating process, for example, before reaching a required thickness of the first redistribution layer 145a, the current density may be increased several times and the increased current density may be applied, thereby forming the first redistribution layer 145a having the second unevenness surface R2.

Subsequently, as illustrated in FIG. 14B, a passivation layer 150 may be formed on a lower surface of the connection member 140, to cover the first redistribution layer 145a.

The passivation layer 150 may be formed using a lamination process. For example, a resin film such as an Ajinomoto Build-up Film (ABF) or a resin-coated film (RCF) may be used in the lamination process. In addition to the lamination process, the passivation layer 150 may also be formed by a coating process using a liquid resin.

Next, as illustrated in FIG. 14C, an opening O may be formed in the passivation layer 150 to expose the first redistribution layer 145a.

In the exemplary embodiment, a first unevenness surface R1 may be formed on a sidewall of the opening O. The first unevenness surface R1 may be connected to a second unevenness surface R2 of the first redistribution pattern 145a.

The first unevenness surface R1 may be obtained in the process of forming the opening O, without any further process. For example, the first unevenness surface R1 may be obtained together with the formation of the opening O by adjusting laser drilling process conditions.

Alternatively, the first unevenness surface R1 may be formed on a sidewall of the opening O by applying an additional subsequent process after forming the opening O.

For example, after the opening O is formed using a process such as laser drilling, the sidewall of the opening may be roughened using an etching solution through a desmearing process. In addition, the sidewall of the opening O may be roughened by an asking process using plasma, for example, $O_2$. In such a subsequent roughening process, an exposed different surface, such as a lower surface, of the passivation layer 150, as well as the sidewall of the opening O, may also be roughened, as shown in FIG. 14E.

Subsequently, as illustrated in FIG. 14D following the process shown in FIG. 14C, or alternatively, as illustrated in FIG. 14F following the process shown in FIG. 14E, a UBM layer 160 and an electrical connection structure 170 may be formed on the passivation layer 150, to be connected to the second redistribution layer 145b.

The UBM layer 160 may be formed on the passivation layer 150 to be connected to the first redistribution pattern 142a exposed to the opening O, and the electrical connection structure 170 may be formed on the UBM layer 160. In the foregoing process, since the first unevenness surface R1 is provided on a sidewall of the opening O, the UBM layer 160, in detail, a UBM via 163, may have a relatively sufficiently wide junction area with the sidewall of the opening O, thereby enhancing adhesive strength. In a case in which the first unevenness surface R1 is provided on a sidewall of the opening O and a lower surface of the passivation layer 150, the UBM layer 160 including a UBM via 163 and a UBM pad 162 may have a relatively sufficiently wide junction area with the sidewall of the opening and the lower surface of the passivation layer 150, respectively, thereby enhancing adhesive strength. Thus, stress and cracking may be prevented from propagating by the first unevenness surface R1 positioned between the passivation layer 150 and the UBM via 163.

Although the first unevenness surface R1 may be relatively short as a thickness of the passivation layer 150 is reduced, the first unevenness surface R1 is connected to the second unevenness surface R2 of the first redistribution pattern 142a, and thus, stress or cracking may be effectively prevented from passing through the first unevenness surface R1 and propagating to the inside of the connection member 140, thereby protecting a further redistribution layer 145.

Figure 15:
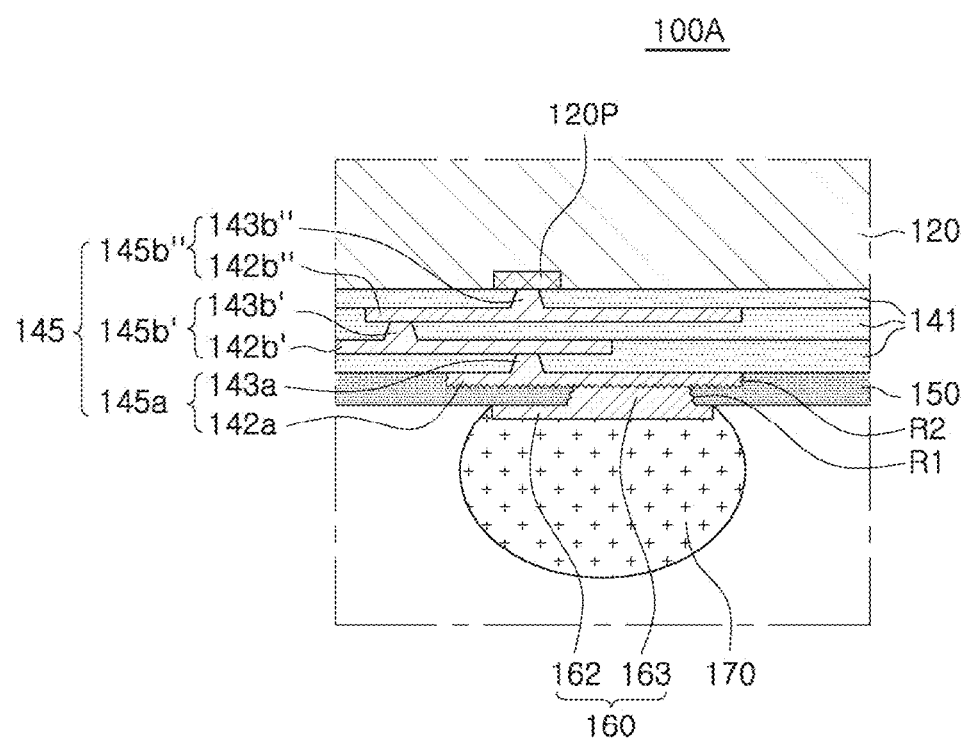
FIG. 15 is a partially enlarged cross-sectional view of a semiconductor package according to an exemplary embodiment in the present disclosure.

FIG. 15 is a partially enlarged cross-sectional view of a semiconductor package according to another exemplary embodiment.

Referring to FIG. 15, a semiconductor package 100A according to an exemplary embodiment may be understood as a semiconductor package having a structure similar to that of the semiconductor package illustrated in FIGS. 9 and 10, except for a structure of redistribution layers 145a, 145b' and 145b". The description of components of the exemplary embodiment may be referred to the description of the same or similar components of the semiconductor package 100 illustrated in FIGS. 9 and 10, unless otherwise stated specifically.

The semiconductor package 100A according to the exemplary embodiment may include insulating members 141 and redistribution layers 145a, 145b' and 145b" having a three-layer structure, formed on different levels of the insulating members 141.

A first redistribution layer 145a may include a first redistribution pattern 142a having the second unevenness surface R2, and a first redistribution via 143a connected to the first redistribution pattern 142a. Second redistribution layers 145b' and 145b" disposed in the insulating members 141 may include two second redistribution patterns 142a' and 142a" and two second redistribution vias 1423' and 143a" located on different levels in a two-layer structure.

In the case of the redistribution layers 145a, 145b' and 145b" of the three-layer structure employed in the exemplary embodiment, an unevenness surface may only be formed on a surface relevant to the first redistribution layer directly connected to a UBM layer. The unevenness surface may be provided to prevent stress around the UBM layer from propagating to the interior of a connection member, and the unevenness surface employed in the exemplary embodiment may be formed on a surface of a metal element in direct contact with a passivation layer. In detail, a first unevenness surface R1 may be provided between a passivation layer 150 and a UBM layer 160, and a second unevenness surface R2 may be provided between the passivation layer 150 and the first redistribution layer 145a, in detail, the first redistribution pattern 142a. In detail, the first unevenness surface R1 and the second unevenness surface R2 may be continuously disposed to effectively block propagation of stress occurring from around the UBM layer 160.

The above descriptions with reference to FIG. 14F may also be applied to the embodiment shown in FIG. 15. Overlapped descriptions will be omitted to avoid redundancy.

Figure 16:
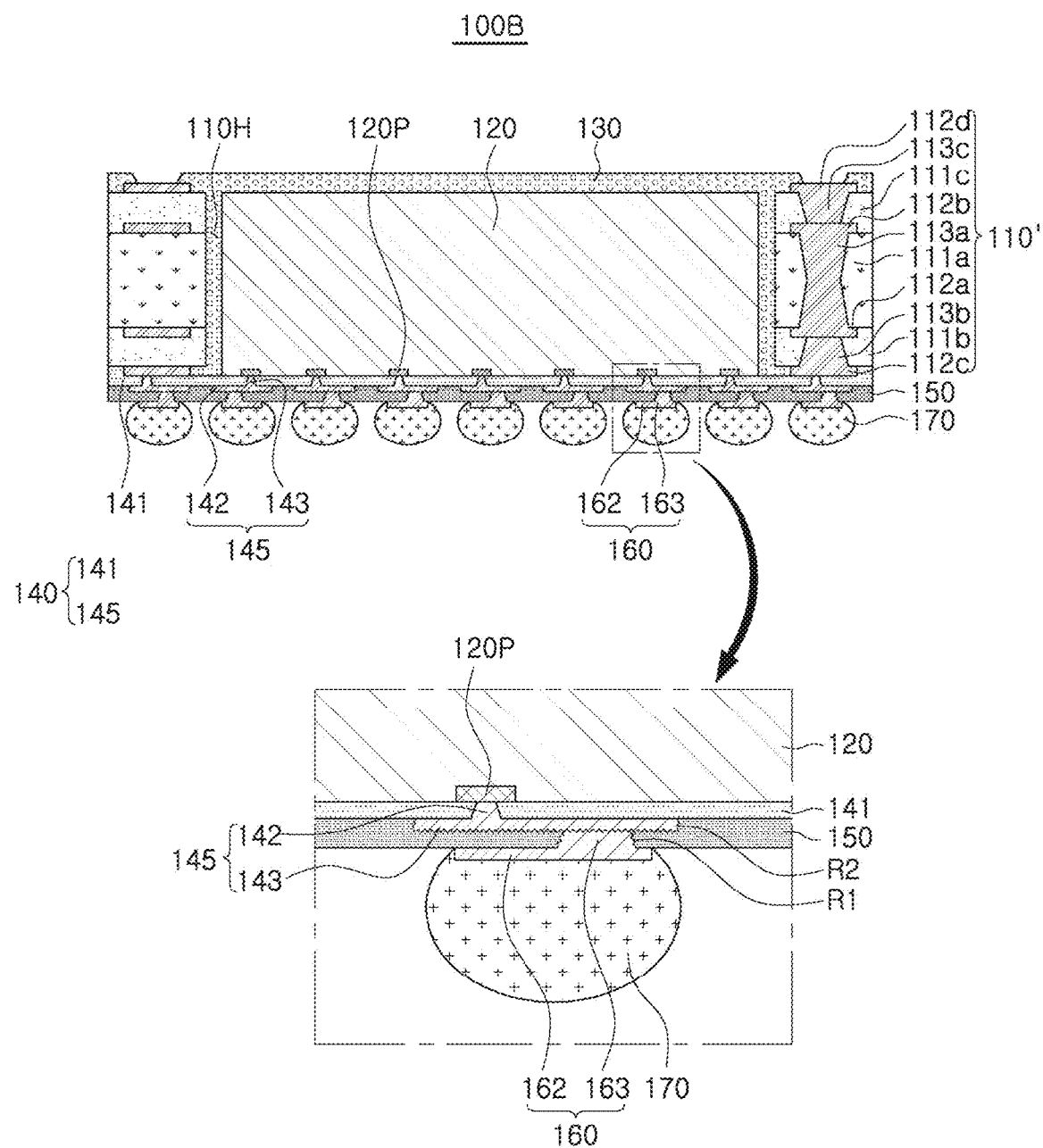
FIG. 16 is a side cross-sectional view illustrating a semiconductor package according to an exemplary embodiment in the present disclosure.

FIG. 16 is a side cross-sectional view illustrating a semiconductor package according to an exemplary embodiment.

Referring to FIG. 16, a semiconductor package 100B according to an exemplary embodiment may be understood as having a structure similar to the structure illustrated in FIG. 9, except for a support member 110' having a distribution structure. The description of components of the exemplary embodiment may be the same as the description of the same or similar components of the semiconductor package 100 illustrated in FIG. 9, unless otherwise specified.

The support member 110' employed in the exemplary embodiment may include a first dielectric layer 111a, a first distribution layer 112a and a second distribution layer 112b disposed on both surfaces of the first dielectric layer 111a, a second dielectric layer 111b disposed on the first distribution layer 112a to cover the first distribution layer 112a, a third distribution layer 112c disposed on the second dielectric layer 111b, a third dielectric layer 111c disposed on the first dielectric layer 111b to cover the second distribution layer 112b, and a fourth distribution layer 112d disposed on the third dielectric layer 111c. The first to fourth distribution layers 112a, 112b, 112c and 112d may be electrically connected to a connection pad 120P of a semiconductor chip 120.

Since the support member 110' may include a relatively large number of first to fourth distribution layers 112a, 112b, 112c and 112d, a connection member 140 may be further simplified. Thus, a reduction in yield due to defects in a process of forming the connection member 140 may be reduced.

On the other hand, the first to fourth distribution layers 112a, 112b, 112c and 112d may be electrically connected to each other through first to third vias 113a, 113b and 113c, passing through the first to third dielectric layers 111a, 111b and 111c, respectively.

The first dielectric layer 111a may have a thickness greater than those of the second dielectric layer 111b and the third dielectric layer 111c. The first dielectric layer 111a may have a relatively great thickness to basically maintain rigidity, and the second dielectric layer 111b and the third dielectric layer 111c may be introduced, to be provided with a relatively large number of distribution layers 112c and 112d. The first dielectric layer 111a may include an insulating material different from that of the second dielectric layer 111b and the third dielectric layer 111c. For example, the first dielectric layer 111a may be formed of, for example, a prepreg resin, including a core material, a filler and an insulating resin, and the second dielectric layer 111b and the third dielectric layer 111c may be an ABF film or a PID film including a filler and an insulating resin, but are not limited thereto. In an aspect similar thereto, the first via 113a penetrating through the first dielectric layer 111a may have a diameter greater than that of each of the second and third vias 113b and 113c penetrating through the second and third dielectric layers 111b and 111c.

A lower surface of the third distribution layer 112c of the support member 110' may be located to be lower than a lower surface of the connection pad 120P of the semiconductor chip 120. A distance between a redistribution pattern 142 of the connection member 140 and the third distribution layer 112c of the support member 110' may be less than a distance between the redistribution pattern 142 of the connection member 140 and the connection pad 120P of the semiconductor chip 120.

As in the exemplary embodiment, the third distribution layer 112c may be disposed on the second dielectric layer 111b to have a form protruding upwardly thereof, and as a result, may thus be in contact with the connection member 140. The first distribution layer 112a and the second distribution layer 112b of the support member 110' may be positioned between an active surface and an inactive surface of the semiconductor chip 120. The support member 110' may be formed to correspond to a thickness of the semiconductor chip 120, and the first distribution layer 112a and the second distribution layer 112b formed in the support member 110' may be disposed on a level between the active surface and the inactive surface the semiconductor chip 120.

The thickness of each of the first to fourth distribution layers 112a, 112b, 112c and 112d of the support member 110' may be greater than a thickness of the distribution pattern 142 of the connection member 140. The support member 110' may have a thickness identical to or greater than that of the semiconductor chip 120. The first to fourth distribution layers 112a, 112b, 112c and 112d may also be formed to have a relatively large size. On the other hand, the redistribution pattern 142 of the connection member 140 may be formed to have a relatively small size to obtain thinning.

The above descriptions with reference to FIG. 14F may also be applied to the embodiment shown in FIG. 16. Overlapped descriptions will be omitted to avoid redundancy.

As set forth above, according to the exemplary embodiment, occurrence and propagation of stress around a UBM layer may be effectively prevented or occurrence of cracks thereby may be effectively prevented, by providing an unevenness surface at an interface between a metal adjacent to the UBM layer, for example, a UBM via and a redistribution layer, and an insulating layer such as a passivation layer.

The meaning of being connected in the present disclosure is not only a direct connection but also a connection including indirect connection through an adhesive layer or the like. In addition, the term "electrically connected" means a concept including both a physical connection and a non-connection. Also, the terms such as 'first,' 'second' and the like are used to distinguish one component from another, and do not limit the order and/or importance degrees of the components. In some cases, without departing from the scope of the right, the first component may be referred to as a second component, and similarly, the second component may be referred to as a first component.

The term 'example' used in the present disclosure does not mean the same embodiment, but is provided for emphasizing and explaining different unique features. However, the above-mentioned examples do not exclude that they are implemented in combination with the features of other examples. For example, although the description in a specific example is not described in another example, it may be understood as a description related to another example, unless otherwise described or contradicted by other examples.

The terms used in the present disclosure are used only to illustrate an example and are not intended to limit the present disclosure. The singular forms include plural expressions unless the context clearly is otherwise indicated.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a connection member having a first surface and a second surface opposing each other and including a plurality of redistribution layers on different levels, the plurality of redistribution layers including a first redistribution layer on the second surface and at least one second redistribution layer on a level different from a level of the first redistribution layer;
   a semiconductor chip disposed on the first surface of the connection member and including a connection pad connected to the at least one second redistribution layer;
   an encapsulant disposed on the first surface of the connection member and sealing the semiconductor chip;
   a passivation layer disposed on the second surface of the connection member, and including a plurality of openings respectively exposing portions of the first redistribution layer;
   a plurality of underbump metallurgy (UBM) layers connected to the portions of the first redistribution layer through the plurality of openings, respectively; and
   a plurality of electrical connection structures disposed on the plurality of UBM layers, respectively,
   wherein an interface between the passivation layer and the plurality of UBM layers has a first unevenness surface, an interface between the passivation layer and the first redistribution layer has a second unevenness surface, connected to the first unevenness surface, and the second unevenness surface has a surface roughness greater than a surface roughness of the at least one second redistribution layer, and
   wherein the surface roughness of the first unevenness surface and the surface roughness of the second unevenness surface are greater than 1 μm.

2. The semiconductor package of claim 1, wherein the UBM layer comprises a plurality of UBM pads disposed on the passivation layer, and a plurality of UBM vias respectively connecting the plurality of UBM pads to the first redistribution layer through the plurality of openings.

3. The semiconductor package of claim 2, wherein the first unevenness surface is disposed on sidewalls of the plurality of UBM vias respectively located in the plurality of openings.

4. The semiconductor package of claim 2, wherein the electrical connection structure is disposed to be in contact with the passivation layer around the UBM pad.

5. The semiconductor package of claim 1, wherein the first unevenness surface and the second unevenness surface have different degrees of surface roughness.

6. The semiconductor package of claim 1, wherein the surface roughness of the first unevenness surface and the surface roughness of the second unevenness surface are less than 3 µm.

7. The semiconductor package of claim 6, wherein the surface roughness of the at least one second redistribution layer is 0.5 µm or less.

8. The semiconductor package of claim 1, wherein the connection member further comprises an insulating member, and the first redistribution layer is disposed on a surface of the insulating member, and the at least one second redistribution layer is disposed in the insulating member.

9. The semiconductor package of claim 8, wherein the first redistribution layer comprises a redistribution pattern disposed on the surface of the insulating member and a redistribution via disposed in the insulating member to be connected to the redistribution pattern and the at least one second redistribution layer, and
the first unevenness surface is disposed on a surface of the redistribution pattern contacting the passivation layer.

10. The semiconductor package of claim 8, wherein the at least one second redistribution layer comprises a plurality of second redistribution layers, disposed on different levels in the insulating member, respectively.

11. The semiconductor package of claim 8, wherein the insulating member comprises a photoimageable insulating material, and the passivation layer comprises a non-photoimageable insulating material.

12. The semiconductor package of claim 1, further comprising a support member disposed on the first surface of the connection member and having a cavity receiving the semiconductor chip.

13. A semiconductor package comprising:
a connection member having a first surface and a second surface opposing each other, and including an insulating member and a plurality of redistribution layers on different levels in the insulating member;
a semiconductor chip disposed on the first surface of the connection member, and including a connection pad connected to the plurality of redistribution layers;
an encapsulant disposed on the first surface of the connection member, and sealing the semiconductor chip;
a passivation layer disposed on the second surface of the connection member;
a plurality of UBM layers including a plurality of UBM pads disposed on the passivation layer, and a plurality of UBM vias passing through the passivation layer, to connect the plurality of UBM pads to the plurality of redistribution layers, respectively; and
a plurality of electrical connection structures respectively disposed on the plurality of UBM pads,
wherein an interface between the passivation layer and the UBM vias has a first unevenness surface, a surface of an outermost redistribution layer among the plurality of redistribution layers has a second unevenness surface, connected to the first unevenness surface, and the outermost redistribution layer has a surface roughness greater than a surface roughness of the other redistribution layers among the plurality of redistribution layers, and
wherein the surface roughness of the first unevenness surface and the surface roughness of the second unevenness surface are greater than 1 µm.

14. The semiconductor package of claim 13, wherein a surface roughness of the first unevenness surface and a surface roughness of the second unevenness surface are less than 3 µm.

15. The semiconductor package of claim 14, wherein the first unevenness surface and the second unevenness surface have different degrees of surface roughness.

16. A semiconductor package comprising:
a connection member including a first redistribution layer, a second redistribution layer, an insulating layer disposed between the first and second redistribution layers, and a via layer passing the insulating layer and connecting the first and second redistribution layers to each other;
a semiconductor chip disposed on the connection member and including a connection pad connected to the second redistribution layer;
an encapsulant sealing the semiconductor chip;
a passivation layer disposed on the first redistribution layer and including an opening exposing a portion of the first redistribution layer;
an underbump metallurgy (UBM) layer connected to the portion of the first redistribution layer through the opening in the passivation layer; and
an electrical connection structure disposed on the UBM layer,
wherein interfaces between the passivation layer and the UBM layer and between the passivation layer and the first redistribution layer extend continuously from a first contacting portion where the electrical connection structure, the UBM layer, and the passivation layer contact with each other to a second contacting portion where the insulating layer of the connection member, the first redistribution layer, and the passivation layer contact with each other, and have a surface roughness greater than a surface roughness of the second redistribution layer, and
wherein the surface roughness of the interfaces between the passivation layer and the UMB layer and between the passivation layer and the first redistribution layer is greater than 1 µm.

17. The semiconductor package of claim 16, wherein the interfaces between the passivation layer and the UBM layer and between the passivation layer and the first redistribution layer have different degrees of surface roughness.

18. The semiconductor package of claim 16, wherein the surface roughness of the interfaces between the passivation layer and the UBM layer and between the passivation layer and the first redistribution layer is less than 3 µm.

19. The semiconductor package of claim 18, wherein the surface roughness of the second redistribution layer is 0.5 µm or less.

20. The semiconductor package of claim 16, wherein the insulating layer of the connection member and the passivation layer are made of different materials.

* * * * *